(12) United States Patent
Morikazu

(10) Patent No.: US 8,728,911 B2
(45) Date of Patent: May 20, 2014

(54) OPTICAL DEVICE WAFER PROCESSING METHOD

(71) Applicant: Disco Corporation, Tokyo (JP)

(72) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 9 days.

(21) Appl. No.: 13/672,065

(22) Filed: Nov. 8, 2012

(65) Prior Publication Data

US 2013/0137203 A1 May 30, 2013

(30) Foreign Application Priority Data

Nov. 24, 2011 (JP) .................................. 2011-256378

(51) Int. Cl.
*H01L 21/30* (2006.01)
(52) U.S. Cl.
USPC ........................................................ 438/458
(58) Field of Classification Search
None
See application file for complete search history.

(56) References Cited

U.S. PATENT DOCUMENTS

| | | | | |
|---|---|---|---|---|
| 6,887,770 B2 * | 5/2005 | Ueda et al. | ..................... | 438/455 |
| 7,608,471 B2 * | 10/2009 | Bahl | ............................... | 438/35 |
| 7,727,790 B2 * | 6/2010 | Zimmerman et al. | .......... | 438/33 |
| 2007/0111480 A1 * | 5/2007 | Maruyama et al. | ........... | 438/463 |
| 2008/0003708 A1 * | 1/2008 | Hoshino et al. | .................. | 438/33 |

FOREIGN PATENT DOCUMENTS

| | | |
|---|---|---|
| JP | 10-305420 | 11/1998 |
| JP | 2005-516415 | 6/2005 |

* cited by examiner

*Primary Examiner* — Scott B Geyer
(74) *Attorney, Agent, or Firm* — Greer Burns & Crain, Ltd.

(57) ABSTRACT

An optical device wafer processing method for processing an wafer having an epitaxy substrate and an optical device layer formed on the front side of the epitaxy substrate through a buffer layer. The buffer layer is to be broken in the condition where the optical device layer is bonded through a bonding metal layer to a transfer substrate. The method includes a buffer layer breaking step of applying a pulsed laser beam having a wavelength having transmissivity to the epitaxy substrate and having absorptivity to the buffer layer from the back side of the epitaxy substrate to the buffer layer, thereby breaking the buffer layer. The buffer layer breaking step includes a first laser beam applying step of completely breaking the buffer layer corresponding to an optical device area and a second laser beam applying step of incompletely breaking the buffer layer corresponding to a peripheral marginal area.

4 Claims, 9 Drawing Sheets

OPTICAL DEVICE WAFER PROCESSING METHOD

BACKGROUND OF THE INVENTION

1. Field of the Invention

The present invention relates to an optical device wafer processing method for transferring an optical device layer in an optical device wafer to a transfer substrate, the optical device layer being composed of an n-type semiconductor layer and a p-type semiconductor layer, the optical device layer being formed on the front side of an epitaxy substrate such as a sapphire substrate and a silicon carbide substrate through a buffer layer, the optical device layer being partitioned by a plurality of crossing streets to define a plurality of regions where a plurality of optical devices such as light emitting diodes and laser diodes are respectively formed.

2. Description of the Related Art

In an optical device fabrication process, an optical device layer composed of an n-type semiconductor layer and a p-type semiconductor layer is formed on the front side of a substantially disk-shaped epitaxy substrate such as a sapphire substrate and a silicon carbide substrate through a buffer layer, and this optical device layer is partitioned by a plurality of crossing streets into a plurality of regions where a plurality of optical devices such as light emitting diodes and laser diodes are respectively formed, thus constituting an optical device wafer. The optical device wafer is divided along the streets to thereby obtain the individual optical devices (see Japanese Patent Laid-Open No. Hei 10-305420, for example).

Further, as a technique for improving the luminance of an optical device, a manufacturing method called lift-off is disclosed in JP-T-2005-516415. In an optical device wafer, an optical device layer composed of an n-type semiconductor layer and a p-type semiconductor layer is formed on the front side of an epitaxy substrate such as a sapphire substrate and a silicon carbide substrate through a buffer layer. The above-mentioned method called lift-off includes the steps of bonding the optical device layer of the optical device wafer through a bonding metal layer formed of gold (Au), platinum (Pt), chromium (Cr), indium (In), or palladium (Pd) to a transfer substrate formed of molybdenum (Mo), copper (Cu), or silicon (Si) and next applying a laser beam from the back side of the epitaxy substrate to the buffer layer to thereby peel off the epitaxy substrate, thus transferring the optical device layer to the transfer substrate.

SUMMARY OF THE INVENTION

In transporting the optical device wafer bonded to the transfer substrate from a laser processing apparatus to a transfer apparatus in order to separate the epitaxy substrate from the optical device layer of the optical device wafer and thereby transfer the optical device layer to the transfer substrate after applying a laser beam having a proper power to the buffer layer in the laser processing apparatus to thereby break the buffer layer, there is a problem such that the epitaxy substrate may drop off from the transfer substrate to cause damage to the epitaxy substrate or the transfer substrate with the optical device layer.

It is therefore an object of the present invention to provide an optical device wafer processing method which can transport the unit of the optical device wafer and the transfer substrate bonded together from the laser processing apparatus to the transfer apparatus without dropping off the epitaxy substrate from the transfer substrate after applying a laser beam having a proper power to the buffer layer to thereby break the buffer layer.

In accordance with an aspect of the present invention, there is provided an optical device wafer processing method for processing an optical device wafer having an epitaxy substrate and an optical device layer formed on the front side of the epitaxy substrate through a buffer layer, the optical device wafer having an optical device area where a plurality of optical devices are formed and a peripheral marginal area surrounding the optical device area, the buffer layer of the optical device wafer being to be broken in the condition where the optical device layer of the optical device wafer is bonded through a bonding metal layer to a transfer substrate, the optical device wafer processing method including a wafer holding step of holding the transfer substrate bonded to the optical device wafer on a chuck table of a laser processing apparatus; and a buffer layer breaking step of applying a pulsed laser beam having a wavelength having transmissivity to the epitaxy substrate and having absorptivity to the buffer layer from the back side of the epitaxy substrate to the buffer layer, thereby breaking the buffer layer; the buffer layer breaking step including a first laser beam applying step of completely breaking the buffer layer corresponding to the optical device area and a second laser beam applying step of incompletely breaking the buffer layer corresponding to the peripheral marginal area.

Preferably, the energy density of the pulsed laser beam to be applied in the first laser beam applying step is set to 0.25 to 1.0 $J/cm^2$, and the energy density of the pulsed laser beam to be applied in the second laser beam applying step is set to 0.1 to 0.15 $J/cm^2$.

Preferably, the number of shots per unit area of the pulsed laser beam to be applied to the buffer layer corresponding to the peripheral marginal area in the second laser beam applying step is set smaller than the number of shots per unit area of the pulsed laser beam to be applied to the buffer layer corresponding to the optical device area in the first laser beam applying step.

Preferably, the second laser beam applying step of incompletely breaking the buffer layer corresponding to the peripheral marginal area is performed simultaneously with the first laser beam applying step of completely breaking the buffer layer corresponding to the optical device area by using the energy propagating from the pulsed laser beam to be applied in the first laser beam applying step.

In the present invention, the buffer layer breaking step of applying a pulsed laser beam having a wavelength having transmissivity to the epitaxy substrate and having absorptivity to the buffer layer from the back side of the epitaxy substrate to the buffer layer includes the first laser beam applying step of completely breaking the buffer layer corresponding to the optical device area and the second laser beam applying step of incompletely breaking the buffer layer corresponding to the peripheral marginal area. Accordingly, the binding function between the epitaxy substrate and the optical device layer by the buffer layer corresponding to the optical device area is completely lost. However, the binding function between the epitaxy substrate and the optical device layer by the buffer layer corresponding to the peripheral marginal area is partially maintained. Accordingly, in transporting the optical device wafer bonded to the transfer substrate from the laser processing apparatus to the transfer apparatus in order to separate the epitaxy substrate from the optical device layer of the optical device wafer and thereby transfer the optical device layer to the transfer substrate after performing the first laser beam applying step and the second laser beam applying step, it is possible to solve the problem that the epitaxy substrate may drop off from the transfer substrate to cause damage to the epitaxy substrate or the transfer substrate with the optical device layer.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
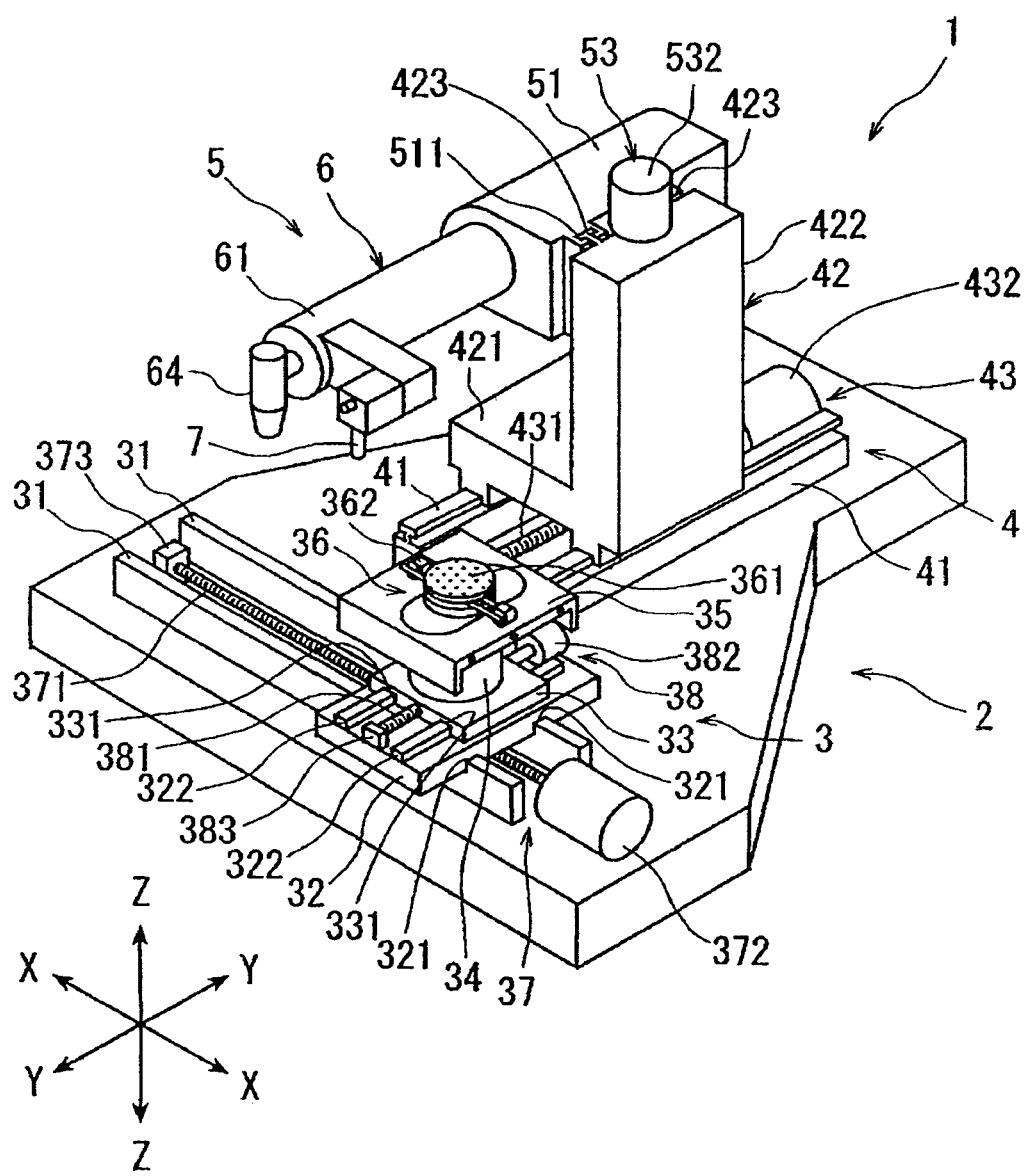
FIG. 1 is a perspective view of a laser processing apparatus for performing the optical device wafer processing method according to the present invention.

A preferred embodiment of the optical device wafer processing method according to the present invention will now be described in detail with reference to the attached drawings. FIG. 1 is a perspective view of a laser processing apparatus 1 for performing the optical device wafer processing method according to the present invention. The laser processing apparatus 1 shown in FIG. 1 includes a stationary base 2, a chuck table mechanism 3 for holding a workpiece, the chuck table mechanism 3 being provided on the stationary base 2 so as to be movable in a feeding direction (X direction) shown by an arrow X, a laser beam applying unit supporting mechanism 4 provided on the stationary base 2 so as to be movable in an indexing direction (Y direction) shown by an arrow Y perpendicular to the X direction, and a laser beam applying unit 5 provided on the laser beam applying unit supporting mechanism 4 so as to be movable in a focal position adjusting direction (Z direction) shown by an arrow Z.

The chuck table mechanism 3 includes a pair of guide rails 31 provided on the stationary base 2 so as to extend parallel to each other in the X direction, a first slide block 32 provided on the guide rails 31 so as to be movable in the X direction, a second slide block 33 provided on the first slide block 32 so as to be movable in the Y direction, a cover table 35 supported by a cylindrical member 34 standing on the second slide block 33, and a chuck table 36 as workpiece holding means. The chuck table 36 has a vacuum chuck 361 formed of a porous material. A workpiece such as a disk-shaped semiconductor wafer is adapted to be held under suction on the upper surface (holding surface) of the vacuum chuck 361 by operating suction means (not shown). The chuck table 36 is rotatable by a pulse motor (not shown) provided in the cylindrical member 34. Further, the chuck table 36 is provided with clamps 362 for fixing an annular frame to be hereinafter described.

The lower surface of the first slide block 32 is formed with a pair of guided grooves 321 for slidably engaging the pair of guide rails 31 mentioned above. A pair of guide rails 322 are provided on the upper surface of the first slide block 32 so as to extend parallel to each other in the Y direction. Accordingly, the first slide block 32 is movable in the X direction along the guide rails 31 by the slidable engagement of the guided grooves 321 with the guide rails 31. The chuck table mechanism 3 further includes feeding means 37 for moving the first slide block 32 in the X direction along the guide rails 31. The feeding means 37 includes an externally threaded rod 371 extending parallel to the guide rails 31 so as to be interposed therebetween and a pulse motor 372 as a drive source for rotationally driving the externally threaded rod 371. The externally threaded rod 371 is rotatably supported at one end thereof to a bearing block 373 fixed to the stationary base 2 and is connected at the other end to the output shaft of the pulse motor 372 so as to receive the torque thereof. The externally threaded rod 371 is engaged with a tapped through hole formed in an internally threaded block (not shown) projecting from the lower surface of the first slide block 32 at a central portion thereof. Accordingly, the first slide block 32 is moved in the X direction along the guide rails 31 by operating the pulse motor 372 to normally or reversely rotate the externally threaded rod 371.

The lower surface of the second slide block 33 is formed with a pair of guided grooves 331 for slidably engaging the pair of guide rails 322 provided on the upper surface of the first slide block 32 as mentioned above. Accordingly, the second slide block 33 is movable in the Y direction along the guide rails 322 by the slidable engagement of the guided grooves 331 with the guide rails 322. The chuck table mechanism 3 further includes first indexing means 38 for moving the second slide block 33 in the Y direction along the guide rails 322. The first indexing means 38 includes an externally threaded rod 381 extending parallel to the guide rails 322 so as to be interposed therebetween and a pulse motor 382 as a drive source for rotationally driving the externally threaded rod 381. The externally threaded rod 381 is rotatably supported at one end thereof to a bearing block 383 fixed to the upper surface of the first slide block 32 and is connected at the other end to the output shaft of the pulse motor 382 so as to receive the torque thereof. The externally threaded rod 381 is engaged with a tapped through hole formed in an internally threaded block (not shown) projecting from the lower surface of the second slide block 33 at a central portion thereof. Accordingly, the second slide block 33 is moved in the Y direction along the guide rails 322 by operating the pulse motor 382 to normally or reversely rotate the externally threaded rod 381.

The laser beam applying unit supporting mechanism 4 includes a pair of guide rails 41 provided on the stationary base 2 so as to extend parallel to each other in the Y direction and a movable support base 42 provided on the guide rails 41 so as to be movable in the Y direction. The movable support base 42 is composed of a horizontal portion 421 slidably supported to the guide rails 41 and a vertical portion 422 extending vertically upward from the upper surface of the horizontal portion 421. Further, a pair of guide rails 423 are provided on one side surface of the vertical portion 422 so as to extend parallel to each other in the Z direction. The laser beam applying unit supporting mechanism 4 further includes second indexing means 43 for moving the movable support base 42 in the Y direction along the guide rails 41. The second indexing means 43 includes an externally threaded rod 431 extending parallel to the guide rails 41 so as to be interposed therebetween and a pulse motor 432 as a drive source for rotationally driving the externally threaded rod 431. The externally threaded rod 431 is rotatably supported at one end thereof to a bearing block (not shown) fixed to the stationary base 2 and is connected at the other end to the output shaft of the pulse motor 432 so as to receive the torque thereof. The externally threaded rod 431 is engaged with a tapped through hole formed in an internally threaded block (not shown) projecting from the lower surface of the horizontal portion 421 at a central portion thereof. Accordingly, the movable support base 42 is moved in the Y direction along the guide rails 41 by operating the pulse motor 432 to normally or reversely rotate the externally threaded rod 431.

The laser beam applying unit 5 includes a unit holder 51 and laser beam applying means 6 mounted to the unit holder 51. The unit holder 51 is formed with a pair of guided grooves 511 for slidably engaging the pair of guide rails 423 provided on the vertical portion 422 of the movable support base 42. Accordingly, the unit holder 51 is supported to the movable support base 42 so as to be movable in the Z direction by the slidable engagement of the guided grooves 511 with the guide rails 423.

The laser beam applying unit 5 further includes focal position adjusting means 53 for moving the unit holder 51 along the guide rails 423 in the Z direction. The focal position adjusting means 53 includes an externally threaded rod (not shown) extending parallel to the guide rails 423 so as to be interposed therebetween and a pulse motor 532 as a drive source for rotationally driving this externally threaded rod. Accordingly, the unit holder 51 and the laser beam applying means 6 are moved in the Z direction along the guide rails 423 by operating the pulse motor 532 to normally or reversely rotate this externally threaded rod. In this preferred embodiment, when the pulse motor 532 is normally operated, the laser beam applying means 6 is moved upward, whereas when the pulse motor 532 is reversely operated, the laser beam applying means 6 is moved downward.

Figure 2:
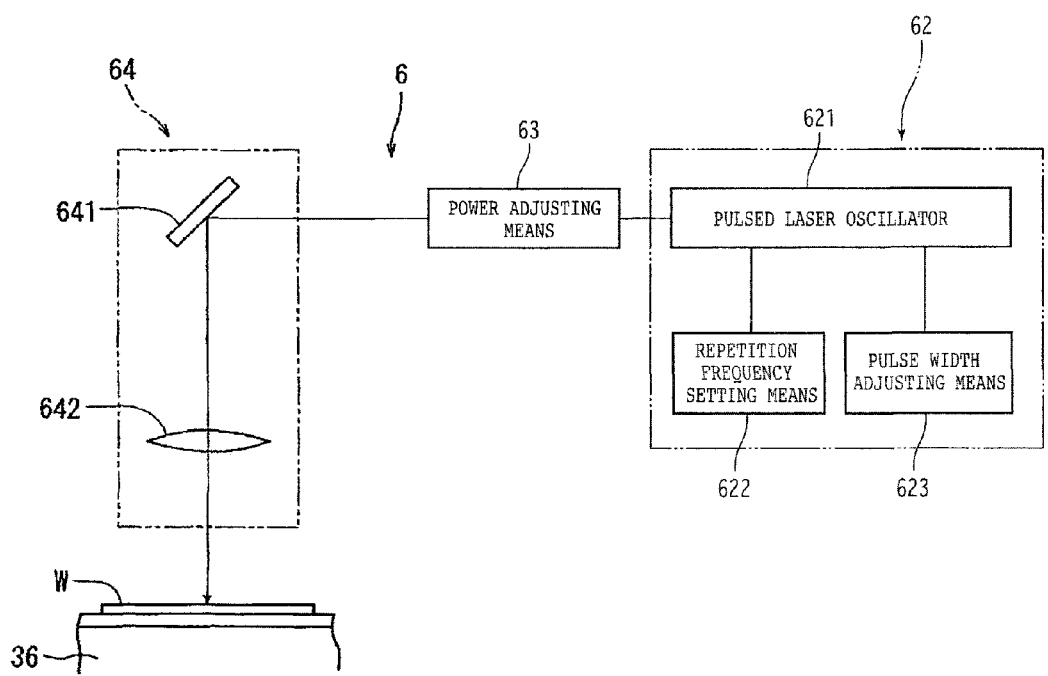
FIG. 2 is a block diagram showing the configuration of laser beam applying means included in the laser processing apparatus shown in FIG. 1.

The laser beam applying means 6 includes a cylindrical casing 61 fixed to the unit holder 51 so as to extend in a substantially horizontal direction. The configuration of the laser beam applying means 6 will now be described with reference to FIG. 2. The laser beam applying means 6 includes pulsed laser beam oscillating means 62 provided in the casing 61, power adjusting means 63 for adjusting the power of a pulsed laser beam oscillated by the pulsed laser beam oscillating means 62, and focusing means 64 for applying the pulsed laser beam whose power has been adjusted by the power adjusting means 63 to a workpiece W held on the holding surface of the chuck table 36.

The pulsed laser beam oscillating means 62 is composed of a pulsed laser oscillator 621 for oscillating a pulsed laser beam having a wavelength of 266 nm, for example, repetition frequency setting means 622 for setting the repetition frequency of the pulsed laser beam to be oscillated by the pulsed laser oscillator 621, and pulse width adjusting means 623 for adjusting the pulse width of the pulsed laser beam to be oscillated by the pulsed laser oscillator 621. The power adjusting means 63 functions to adjust the power of the pulsed laser beam oscillated by the pulsed laser beam oscillating means 62 to a predetermined power. All of the pulsed laser oscillator 621, the repetition frequency setting means 622, and the pulse width adjusting means 623 of the pulsed laser beam oscillating means 62 and the power adjusting means 63 are controlled by control means (not shown).

The focusing means 64 includes a direction changing mirror 641 for changing the traveling direction of the pulsed laser beam oscillated by the pulsed laser beam oscillating means 62 and adjusted in power by the power adjusting means 63 toward the holding surface of the chuck table 36 and a focusing lens 642 for focusing the pulsed laser beam whose traveling direction has been changed by the direction changing mirror 641 and applying the pulsed laser beam to the workpiece W held on the chuck table 36. The focusing means 64 is mounted on the front end of the casing 61 as shown in FIG. 1.

Referring back to FIG. 1, the laser processing apparatus 1 further includes alignment means 7 provided at the front end portion of the casing 61 for imaging a subject area to be laser-processed by the laser beam applying means 6. The alignment means 7 is configured by optical means including a microscope and a CCD camera. An image signal output from the alignment means 7 is transmitted to the control means (not shown).

Figure 3A:
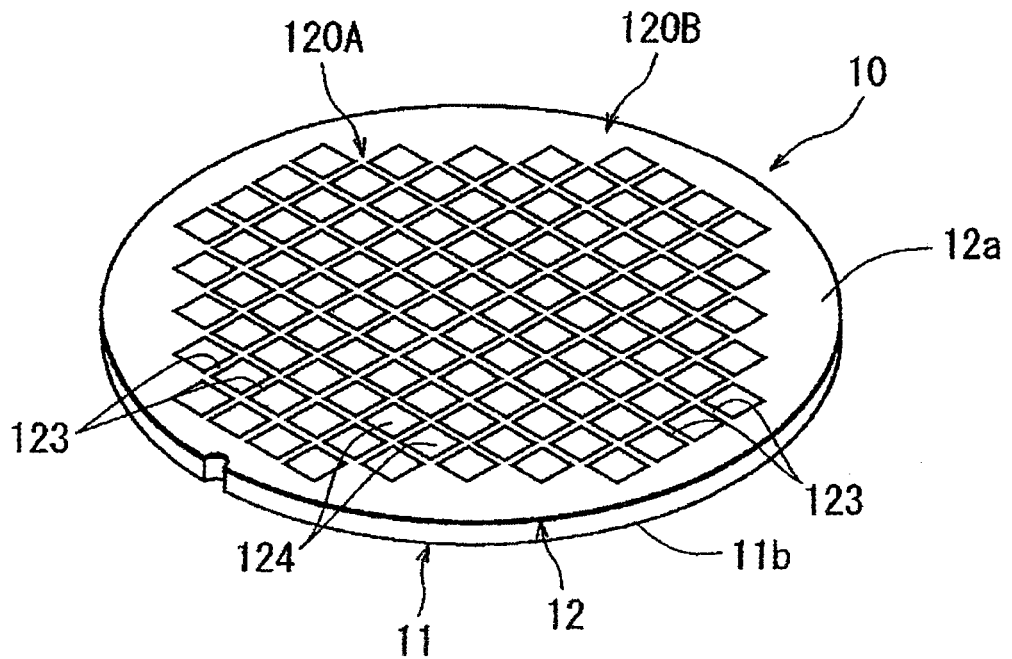
FIG. 3A is a perspective view of an optical device wafer to be processed by the optical device wafer processing method according to the present invention.
Figure 3B:
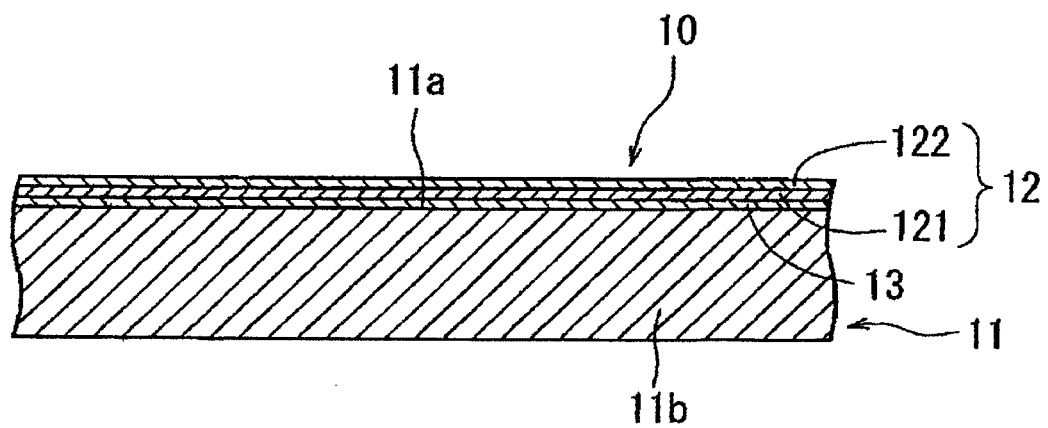
FIG. 3B is an enlarged sectional view of an essential part of the optical device wafer shown in FIG. 3A.

The operation of the laser processing apparatus 1 configured above will now be described. FIG. 3A is a perspective view of an optical device wafer 10 to be processed by the laser processing apparatus 1, and FIG. 3B is an enlarged sectional view of an essential part of the optical device wafer 10 shown in FIG. 3A. The optical device wafer 10 shown in FIGS. 3A and 3B is formed by epitaxial growth of an optical device layer 12 on the front side 11a of a circular epitaxy substrate 11. The epitaxy substrate 11 is formed from a sapphire substrate. The epitaxy substrate 11 has a diameter of 50 mm and a thickness of 600 μm, for example. The optical device layer 12 is composed of an n-type gallium nitride semiconductor layer 121 and a p-type gallium nitride semiconductor layer 122. In forming the optical device layer 12 composed of the n-type gallium nitride semiconductor layer 121 and the p-type gallium nitride semiconductor layer 122 on the front side 11a of the epitaxy substrate 11 by epitaxial growth, a buffer layer 13 of gallium nitride (GaN) is formed between the front side 11a of the epitaxy substrate 11 and the n-type gallium nitride semiconductor layer 121 forming the optical device layer 12. The buffer layer 13 has a thickness of 1 μm, for example, and the optical device layer 12 has a thickness of 10 μm, for example. As shown in FIG. 3A, the optical device layer 12 is partitioned by a plurality of crossing streets 123 to define a plurality of regions where a plurality of optical devices 124 are respectively formed. The optical device wafer 10 has an optical device area 120A where the optical devices 124 are formed and a peripheral marginal area 120B surrounding the optical device area 120A.

Figure 4A:
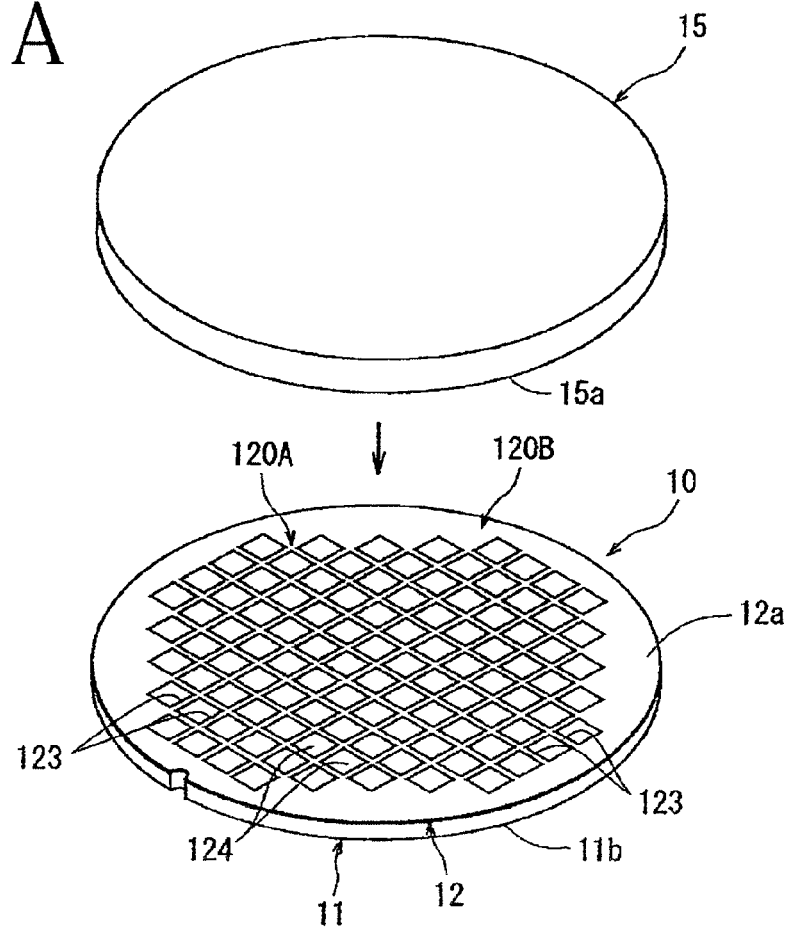
FIG. 4A is a perspective view for illustrating a transfer substrate bonding step of bonding a transfer substrate to the front side of an optical device layer of the optical device wafer shown in FIG. 3A.
Figure 4B:
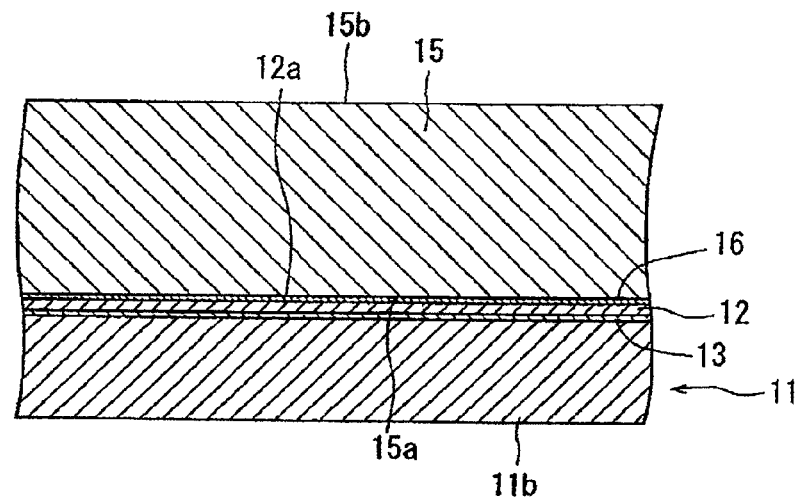
FIG. 4B is an enlarged sectional view of an essential part of the unit of the optical device wafer and the transfer substrate bonded together by the transfer substrate bonding step shown in FIG. 4A.

To peel off the epitaxy substrate 11 from the optical device layer 12 in the optical device wafer 10 and transfer the optical device layer 12 to a transfer substrate, a transfer substrate bonding step is first performed in such a manner that the transfer substrate is bonded to the front side 12a of the optical device layer 12. More specifically, as shown in FIGS. 4A and 4B, a transfer substrate 15 having a thickness of 1 mm, for example, is bonded through a bonding metal layer 16 to the front side 12a of the optical device layer 12 formed on the front side 11a of the epitaxy substrate 11 constituting the optical device wafer 10. In this preferred embodiment, the transfer substrate 15 is formed of copper, and the bonding metal layer 16 is formed of tin. The transfer substrate 15 may be formed of molybdenum (Mo) or silicon (Si), for example, and the bonding metal layer 16 may be formed of gold (Au), platinum (Pt), chromium (Cr), indium (In), or palladium (Pd), for example, as a bonding metal. This transfer substrate bonding step is performed in the following manner. The bonding metal mentioned above is deposited by evaporation to the front side 12a of the optical device layer 12 formed on the front side 11a of the epitaxy substrate 11 or to the front side 15a of the transfer substrate 15, thereby forming the bonding metal layer 16 having a thickness of about 3 μm. Thereafter, the bonding metal layer 16 is brought into pressure contact with the front side 15a of the transfer substrate 15 or the front side 12a of the optical device layer 12, thereby bonding the front side 15a of the transfer substrate 15 through the bonding metal layer 16 to the front side 12a of the optical device layer 12 constituting the optical device wafer 10.

Figure 5:
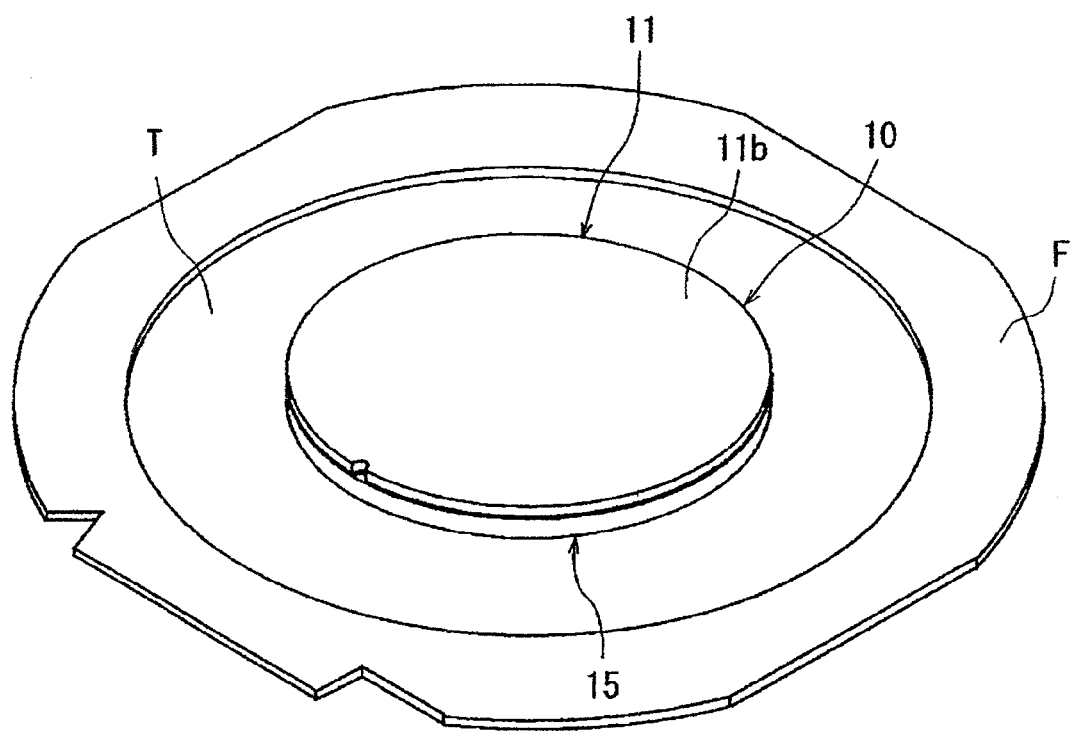
FIG. 5 is a perspective view showing a condition that the transfer substrate bonded to the optical device wafer is attached to a dicing tape supported to an annular frame.

There will now be described a buffer layer breaking step of breaking the buffer layer 13 by applying a laser beam to the buffer layer 13 from the back side of the epitaxy substrate 11 with the use of the laser processing apparatus 1. In performing the buffer layer breaking step, the transfer substrate 15 bonded to the optical device wafer 10 is attached to the front side (adhesive surface) of a dicing tape T supported to an annular frame F as shown in FIG. 5 (wafer supporting step). Accordingly, the back side 11b of the epitaxy substrate 11 of the optical device wafer 10 is oriented upward in the condition where the unit of the optical device wafer 10 and the transfer substrate 15 is supported through the dicing tape T to the annular frame F.

After performing the wafer supporting step mentioned above, the unit of the optical device wafer 10 and the transfer substrate 15 supported through the dicing tape T to the annular frame F is placed on the chuck table 36 of the laser processing apparatus 1 shown in FIG. 1 in the condition where the dicing tape T comes into contact with the upper surface of the chuck table 36. By operating the suction means (not shown), the unit of the optical device wafer 10 and the transfer substrate 15 is held under suction through the dicing tape T on the chuck table 36 (wafer holding step). Accordingly, the back side 11b of the epitaxy substrate 11 of the optical device wafer 10 is oriented upward in the condition where the unit of the optical device wafer 10 and the transfer substrate 15 is held under suction through the dicing tape T on the chuck table 36. Further, the annular frame F supporting the dicing tape T is fixed by the clamps 362 provided on the chuck table 36.

After performing the wafer holding step mentioned above, the buffer layer breaking step of breaking the buffer layer 13 is performed in such a manner that a laser beam having a wavelength having transmissivity to sapphire and having absorptivity to gallium nitride (GaN) is applied to the buffer layer 13 from the back side 11b (upper surface) of the epitaxy substrate 11. This buffer layer breaking step includes a first laser beam applying step of completely breaking the buffer layer 13 corresponding to the optical device area 120A and a second laser beam applying step of incompletely breaking the buffer layer 13 corresponding to the peripheral marginal area 120B.

Figure 6A:
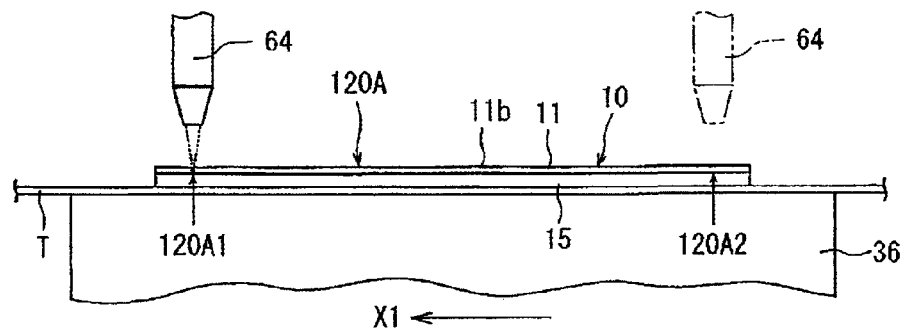
FIGS. 6A to 6C are views for illustrating a first laser beam applying step in the optical device wafer processing method according to the present invention.
Figure 6B:
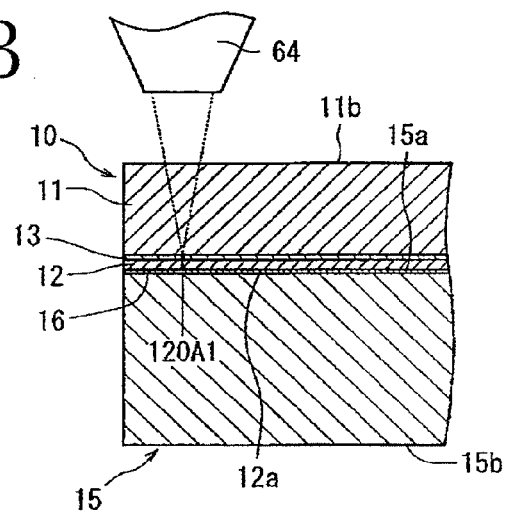
Figure 6C:
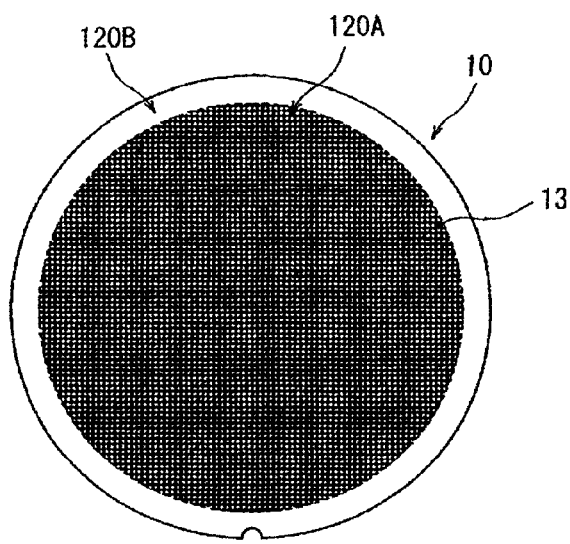

The first laser beam applying step in the buffer layer breaking step will now be described with reference to FIGS. 6A to 6C. The first laser beam applying step of completely breaking the buffer layer 13 corresponding to the optical device area 120A is performed in the following manner. As shown in FIG. 6A, the chuck table 36 is moved to a laser beam applying area below the focusing means 64 of the laser beam applying means 6 so that one end (120A1) of the optical device area 120A is positioned directly below the focusing means 64 of the laser beam applying means 6. As shown in FIG. 6B, the spot diameter of the spot to be formed on the upper surface of the buffer layer 13 by the pulsed laser beam applied from the focusing means 64 is set to 30 μm. This spot diameter may be a focused spot diameter or a defocused spot diameter. Thereafter, the pulsed laser beam oscillating means 62 is operated to apply the pulsed laser beam from the focusing means 64, and at the same time the chuck table 36 is moved in the direction shown by an arrow X1 in FIG. 6A at a predetermined feed speed. When the other end (120A2) of the optical device area 120A reaches the position directly below the focusing means 64, the application of the pulsed laser beam is stopped and the movement of the chuck table 36 is also stopped (first laser beam applying step). This first laser beam applying step is performed over the entire surface of the buffer layer 13 corresponding to the optical device area 120A as shown in FIG. 6C. As a result, the buffer layer 13 corresponding to the optical device area 120A is completely broken to lose its binding function of binding the epitaxy substrate 11 and the optical device layer 12 in the optical device area 120A.

For example, the first laser beam applying step mentioned above is performed under the following processing conditions.

Light source: YAG pulsed laser
Wavelength: 266 nm
Average power: 0.09 to 0.35 W
Repetition frequency: 50 kHz
Pulse width: 100 ps
Spot diameter: 30 μm
Energy density: 0.25 to 1.0 J/cm$^2$
Work feed speed: 600 mm/s As a modification, the first laser beam applying step of breaking the buffer layer 13 may be performed in the following manner. First, the focusing means 64 is positioned directly above one end (120A1) of the optical device area 120A. Thereafter, the laser beam is applied from the focusing means 64 and the focusing means 64 is moved toward the center of the optical device area 120A as rotating the chuck table 36, thereby applying the laser beam over the entire surface of the buffer layer 13 corresponding to the optical device area 120A. As a result, the buffer layer 13 corresponding to the optical device area 120A is completely broken to lose the binding function between the epitaxy substrate 11 and the optical device layer 12 in the optical device area 120A.

Figure 7A:
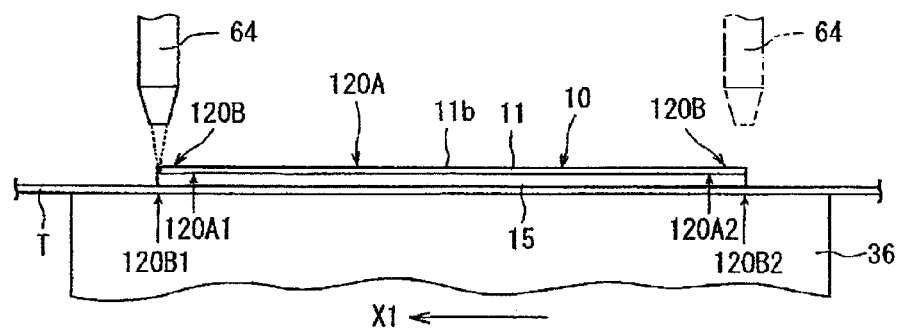
FIGS. 7A to 7C are views for illustrating a second laser beam applying step in the optical device wafer processing method according to the present invention.
Figure 7B:
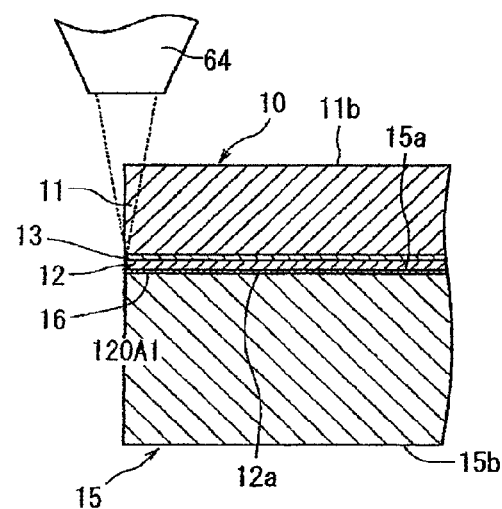
Figure 7C:
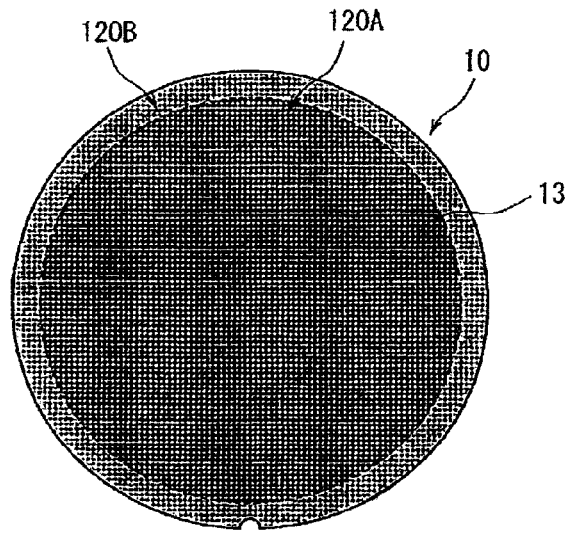

The second laser beam applying step in the buffer layer breaking step will now be described with reference to FIGS. 7A to 7C. The second laser beam applying step of incompletely breaking the buffer layer 13 corresponding to the peripheral marginal area 120B is performed in the following manner. As shown in FIG. 7A, the chuck table 36 is moved to a laser beam applying area below the focusing means 64 of the laser beam applying means 6 so that one end (120B1) of the peripheral marginal area 120B is positioned directly below the focusing means 64 of the laser beam applying means 6. As shown in FIG. 7B, the spot diameter of the spot to be formed on the upper surface of the buffer layer 13 by the pulsed laser beam applied from the focusing means 64 is set to 30 μm. This spot diameter may be a focused spot diameter or a defocused spot diameter. Thereafter, the pulsed laser beam oscillating means 62 is operated to apply the pulsed laser beam from the focusing means 64, and at the same time the chuck table 36 is moved in the direction shown by an arrow X1 in FIG. 7A at a predetermined feed speed. When the boundary (120A1) between the peripheral marginal area 120B and the optical device area 120A reached the position directly below the focusing means 64, the application of the pulsed laser beam is temporarily stopped. The movement of the chuck table 36 in the direction of the arrow X1 is continued. When the boundary (120A2) between the optical device area 120A and the peripheral marginal area 120B reaches the position directly below the focusing means 64, the application of the pulsed laser beam is restarted. Thereafter, when the other end (120B2) of the peripheral marginal area 120B reaches the position directly below the focusing means 64, the application of the pulsed laser beam is stopped and the movement of the chuck table 36 is also stopped (second laser beam applying step). This second laser beam applying step is performed over the entire surface of the buffer layer 13 corresponding to the peripheral marginal area 120B as shown in FIG. 7C. As a result, the buffer layer 13 corresponding to the peripheral marginal area 120B is incompletely broken to lose most of the binding function between the epitaxy substrate 11 and the optical device layer 12 in the peripheral marginal area 120B. However, the binding function of the buffer layer 13 corresponding to the peripheral marginal area 120B is partially maintained.

For example, the second laser beam applying step mentioned above is performed under the following processing conditions.

Light source: YAG pulsed laser
Wavelength: 266 nm
Average power: 0.035 to 0.05 W
Repetition frequency: 50 kHz
Pulse width: 100 ps
Spot diameter: 30 μm
Energy density: 0.1 to 0.15 J/cm$^2$
Work feed speed: 600 mm/s As a modification, the second laser beam applying step of breaking the buffer layer 13 may be performed in the following manner. First, the focusing means 64 is positioned directly below one end (120B1) of the peripheral marginal area 120B. Thereafter, the laser beam is applied from the focusing means 64 and the focusing means 64 is moved toward the boundary (120A1) between the peripheral marginal area 120B and the optical device area 120A as rotating the chuck table 36, thereby applying the laser beam over the entire surface of the buffer layer 13 corresponding to the peripheral marginal area 120B. As a result, the buffer layer 13 corresponding to the peripheral marginal area 120B is incompletely broken.

Figure 8A:
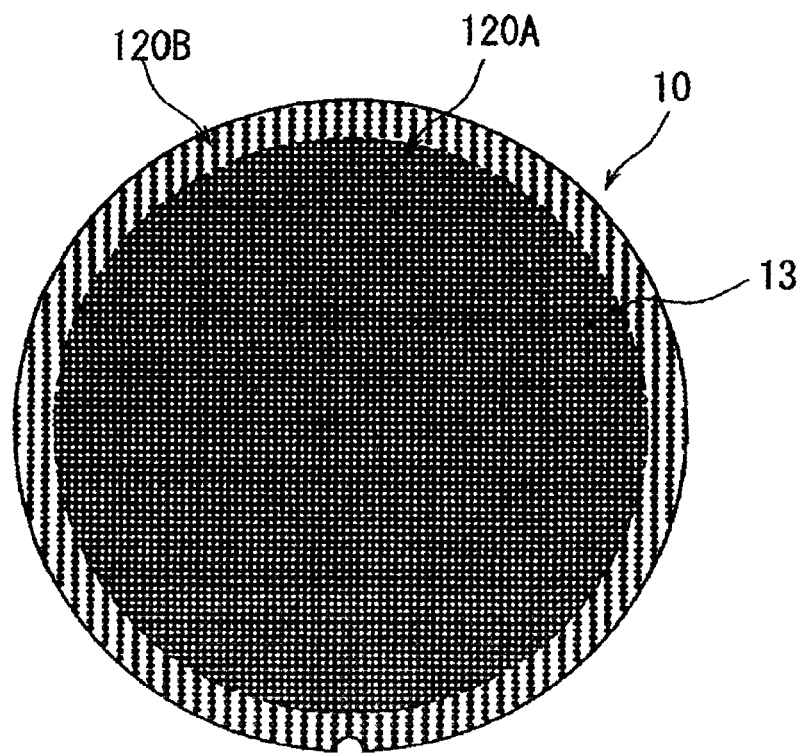
FIGS. 8A and 8B are views for illustrating another preferred embodiment of the second laser beam applying step in the optical device wafer processing method according to the present invention.
Figure 8B:
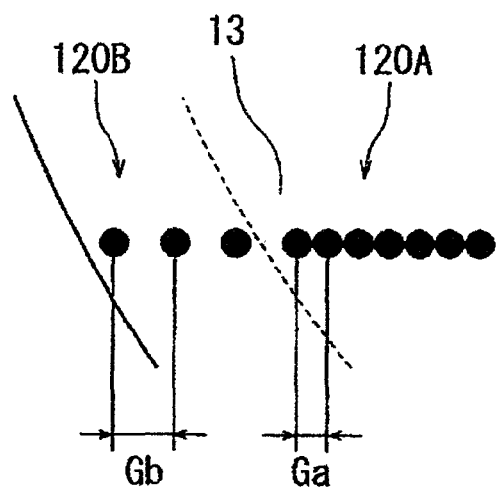

There will now be described another preferred embodiment of the second laser beam applying step of incompletely breaking the buffer layer 13 corresponding to the peripheral marginal area 120B with reference to FIGS. 8A and 8B. In the second laser beam applying step shown in FIGS. 8A and 8B, the spot spacing (Gb) of the pulsed laser beam to be applied to the buffer layer 13 corresponding to the peripheral marginal area 120B is set larger than the spot spacing (Ga) of the pulsed laser beam to be applied to the buffer layer 13 corresponding to the optical device area 120A in the first laser beam applying step, so that the number of shots per unit area of the pulsed laser beam to be applied to the buffer layer 13 corresponding to the peripheral marginal area 120B is set smaller than the number of shots per unit area of the pulsed laser beam to be applied to the buffer layer 13 corresponding to the optical device area 120A. For example, the work feed speed in the processing conditions of the second laser beam applying step may be set higher than the work feed speed (600 mm/s) in the processing conditions of the first laser beam applying step, thereby increasing the spot spacing of the pulsed laser beam to be applied to the buffer layer 13 corresponding to the peripheral marginal area 120B.

Preferably, the energy density of the pulsed laser beam to be applied in the first laser beam applying step is set to 0.25 to 1.0 J/cm$^2$, and the energy density of the pulsed laser beam to be applied in the second laser beam applying step is set to 0.1 to 0.15 J/cm$^2$. The energy density is obtained by dividing the average power of the pulsed laser beam by the repetition frequency and further dividing the resultant quotient by the area of the spot. Accordingly, the energy density can be set to the above preferable values by suitably combining the average power, repetition frequency, and spot diameter of the pulsed laser beam.

As still another preferred embodiment of the second laser beam applying step of incompletely breaking the buffer layer corresponding to the peripheral marginal area, the second laser beam applying step may be performed simultaneously with the first laser beam applying step of completely breaking the buffer layer corresponding to the optical device area by using the energy propagating from the pulsed laser beam to be applied in the first laser beam applying step. In this case, the pulsed laser beam application start position in the first laser beam applying step is set at a position inside by 35 μm, for example, from the outer circumference of the peripheral marginal area. Accordingly, in the case that the spot diameter of the pulsed laser beam is 30 μm, the buffer layer corresponding to the peripheral marginal area is completely broken in an inner circumferential range inside of the position of 20 μm from the outer circumference of the peripheral marginal area by the spot of the pulsed laser beam, whereas the buffer layer corresponding to the peripheral marginal area is incompletely broken in an outer circumferential range inside by 20 μm from the outer circumference of the peripheral marginal area by the energy propagating from the pulsed laser beam.

Figure 9A:
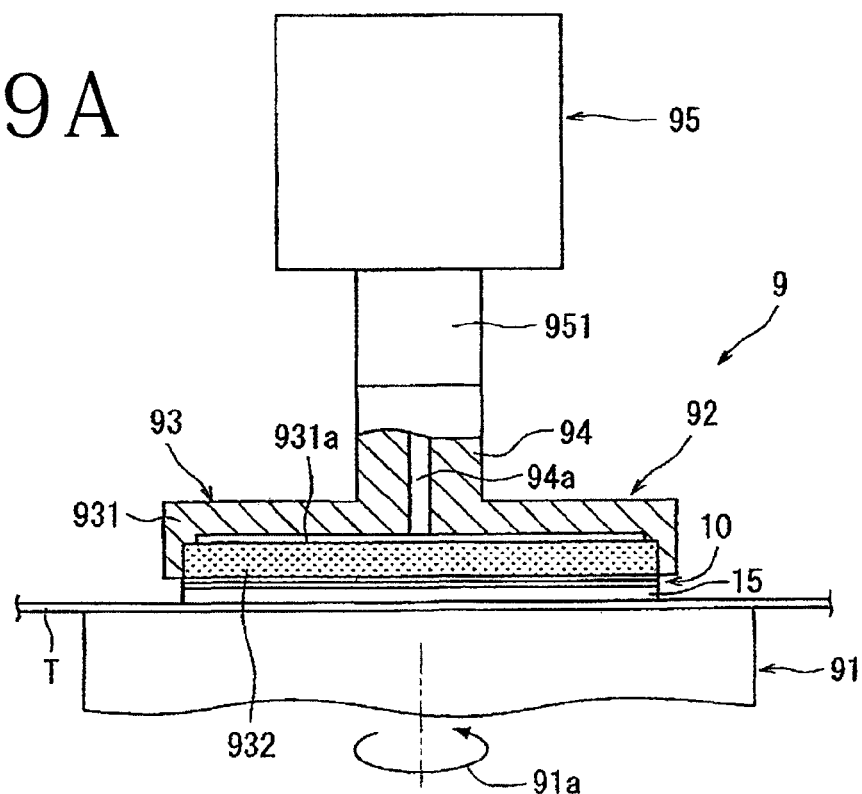
FIGS. 9A and 9B are partially sectional side views for illustrating an optical device layer transfer step in the optical device wafer processing method according to the present invention.
Figure 9B:
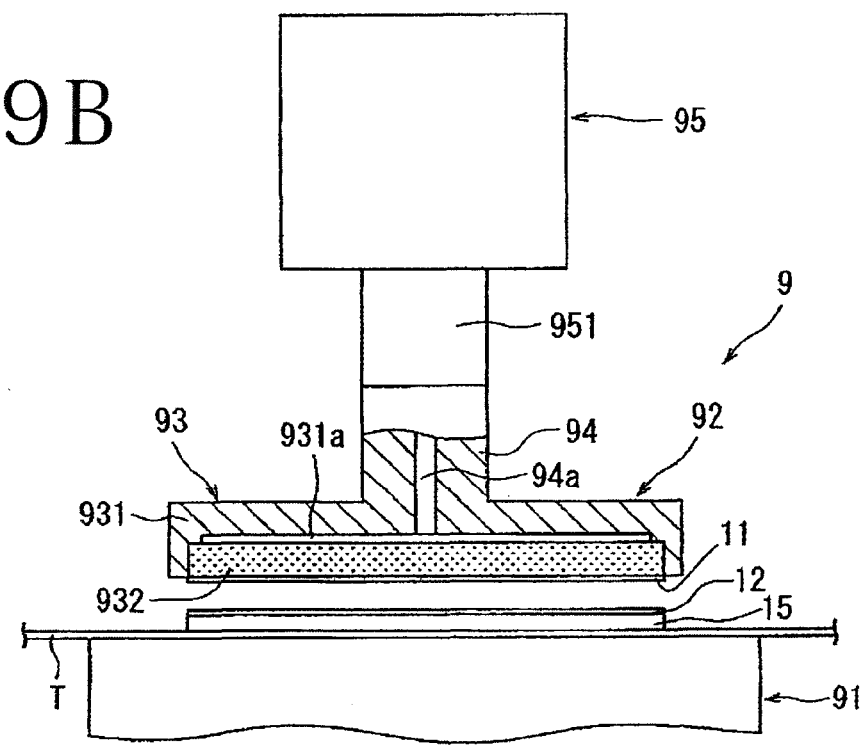

After performing the buffer layer breaking step composed of the first laser beam applying step and the second laser beam applying step as mentioned above, an optical device layer transfer step is performed in such a manner that the epitaxy substrate 11 is peeled off from the optical device layer 12 to thereby transfer the optical device layer 12 to the transfer substrate 15. This optical device layer transfer step is performed by using a transfer apparatus 9 shown in FIGS. 9A and 9B. As shown in FIGS. 9A and 9B, the transfer apparatus 9 includes first holding means 91 for holding the unit of the optical device wafer 10 and the transfer substrate 15 bonded together in the condition where the transfer substrate 15 is attached to the dicing tape T and second holding means 92 provided above the first holding means 91 for holding the epitaxy substrate 11 of the optical device wafer 10 bonded to the transfer substrate 15. The first holding means 91 has an upper surface as a first holding surface for holding the unit of the optical device wafer 10 and the transfer substrate 15 through the dicing tape T under suction. Further, the first holding means 91 is rotatable by a rotational drive mechanism (not shown). The second holding means 92 includes a suction holding pad 93 and a support shaft portion 94 for supporting the suction holding pad 93. The suction holding pad 93 is composed of a disk-shaped base 931 and a disk-shaped pad body 932, supported to the base 931.

The base 931 constituting the suction holding pad 93 is formed of a suitable metal material, and the support shaft portion 94 projects from the upper surface of the base 931 at its central portion. The lower surface of the base 931 is formed with a circular recess 931a, and the pad body 932 is fitted in the circular recess 931a of the base 931. The pad body 932 is formed of a porous ceramic material. The lower surface of the pad body 932 fitted in the circular recess 931a of the base 93 functions as a second holding surface, and this second holding surface is opposed to the upper surface of the first holding means 91 as the first holding surface. The circular recess 931a of the base 931 constituting the suction holding pad 93 is in communication with suction means (not shown) through a suction passage 94a formed in the support shaft portion 94. Accordingly, when the suction means (not shown) is operated, a vacuum acts on the lower surface of the pad body 932 as the second holding surface through the suction passage 94a and the recess 931a. As a result, the epitaxy substrate 11 of the optical device wafer 10 can be held under suction on the lower surface of the pad body 932 as the second holding surface.

The second holding means 92 is connected to separating means 95 movable in the vertical direction. In this preferred embodiment, the separating means 95 is provided by an air cylinder mechanism having a piston rod 951, which is connected to the support shaft portion 94 constituting the second holding means 92. The separating means 95 is operated to vertically move the piston rod 951 connected to the second holding means 92 located above the first holding means 91, thereby moving the second holding means 92 toward or away from the first holding means 91.

The optical device layer transfer step using the transfer apparatus 9 mentioned above is performed in the following manner. As shown in FIG. 9A, the unit of the optical device wafer 10 and the transfer substrate 15 bonded together is placed on the first holding means 91 of the transfer apparatus 9 in the condition where the dicing tape T attached to the transfer substrate 15 is in contact with the upper surface of the first holding means 91. Thereafter, the suction means (not shown) is operated to hold the unit of the optical device wafer 10 and the transfer substrate 15 through the dicing tape T under suction (wafer holding step). Accordingly, the back side 11b of the epitaxy substrate 11 of the optical device wafer 10 bonded to the transfer substrate 15 held on the first holding means 91 through the dicing tape T is oriented upward. Further, the annular frame F supporting the dicing tape T is fixed by clamps (not shown) provided on the first holding means 91. Thereafter, the separating means 95 provided by an air cylinder mechanism is operated to lower the second holding means 92 until the lower surface of the pad body 932 of the suction holding pad 93 as the second holding surface comes into contact with the upper surface of the epitaxy substrate 11, i.e., the back side 11b of the epitaxy substrate 11 of the optical device wafer 10 held on the first holding means 91 under suction as shown in FIG. 9A. In this condition, the suction means (not shown) is operated to hold the upper surface (back side 11b) of the epitaxy substrate 11 on the lower surface (second holding surface) of the pad body 932 of the suction holding pad 93 under suction.

Accordingly, the transfer substrate 15 is held on the first holding means 91 through the dicing tape T under suction, whereas the epitaxy substrate 11 is held on the second holding means 92 under suction. Thereafter, the rotational drive mechanism (not shown) for rotating the first holding means 91 is operated to rotate the first holding means 91 in the direction shown by an arrow 91a by a predetermined angle as shown in FIG. 9A. As a result, the buffer layer 13 corresponding to the peripheral marginal area 120B in the incomplete broken condition is completely broken. After completely breaking the buffer layer 13 corresponding to the peripheral marginal area 120B as mentioned above, the separating means 95 provided by an air cylinder mechanism is operated to raise the second holding means 92 as shown in FIG. 9B. As a result, the epitaxy substrate 11 is separated from the optical device layer 12 in the condition where the epitaxy substrate 11 is held under suction on the lower surface of the pad body 932 constituting the suction holding pad 93 of the second holding means 92, so that the optical device layer 12 is transferred to the transfer substrate 15 (optical device layer transfer step).

As described above, the optical device wafer processing method according to the present invention includes the first laser beam applying step of completely breaking the buffer layer 13 corresponding to the optical device area 120A and the second laser beam applying step of incompletely breaking the buffer layer 13 corresponding to the peripheral marginal area 120B. Accordingly, the binding function between the epitaxy substrate 11 and the optical device layer 12 by the buffer layer 13 corresponding to the optical device area 120A is completely lost. However, the binding function between the epitaxy substrate 11 and the optical device layer 12 by the buffer layer 13 corresponding to the peripheral marginal area 120B is partially maintained. Accordingly, in transporting the optical device wafer 10 bonded to the transfer substrate 15 from the laser processing apparatus 1 to the transfer apparatus 9 in order to separate the epitaxy substrate 11 from the optical device layer 12 of the optical device wafer 10 and thereby transfer the optical device layer 12 to the transfer substrate 15 after performing the first laser beam applying step and the second laser beam applying step, it is possible to solve the problem that the epitaxy substrate 11 may drop off from the transfer substrate 15 to cause damage to the epitaxy substrate 11 or the transfer substrate 15 with the optical device layer 12.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for processing an optical device wafer having an epitaxy substrate and an optical device layer formed on a front side of said epitaxy substrate through a buffer layer, said optical device wafer having an optical device area where a plurality of optical devices are formed and a peripheral marginal area surrounding said optical device area, said buffer layer of said optical device wafer being to be broken in a condition where said optical device layer of said optical device wafer is bonded through a bonding metal layer to a transfer substrate, said optical device wafer processing method comprising:

a wafer holding step of holding said transfer substrate bonded to said optical device wafer on a chuck table of a laser processing apparatus; and a buffer layer breaking step of applying a pulsed laser beam having a wavelength having transmissivity to said epitaxy substrate and having absorptivity to said buffer layer from a back side of said epitaxy substrate to said buffer layer, thereby breaking said buffer layer;

said buffer layer breaking step including a first laser beam applying step of completely breaking said buffer layer corresponding to said optical device area and a second laser beam applying step of incompletely breaking said buffer layer corresponding to said peripheral marginal area.

2. The optical device wafer processing method according to claim 1, wherein
the energy density of said pulsed laser beam to be applied in said first laser beam applying step is set to 0.25 to 1.0 J/cm$^2$, and the energy density of said pulsed laser beam to be applied in said second laser beam applying step is set to 0.1 to 0.15 J/cm$^2$.

3. The optical device wafer processing method according to claim 1, wherein
the number of shots per unit area of said pulsed laser beam to be applied to said buffer layer corresponding to said peripheral marginal area in said second laser beam applying step is set smaller than the number of shots per unit area of said pulsed laser beam to be applied to said buffer layer corresponding to said optical device area in said first laser beam applying step.

4. The optical device wafer processing method according to claim 1, wherein
said second laser beam applying step of incompletely breaking said buffer layer corresponding to said peripheral marginal area is performed simultaneously with said first laser beam applying step of completely breaking said buffer layer corresponding to said optical device area by using the energy propagating from said pulsed laser beam to be applied in said first laser beam applying step.

* * * * *